(12) United States Patent
Mizunashi

(10) Patent No.: US 11,028,267 B2
(45) Date of Patent: Jun. 8, 2021

(54) CURABLE ORGANOSILICON RESIN COMPOSITION AND SEMICONDUCTOR DEVICE

(71) Applicant: SHIN-ETSU CHEMICAL CO., LTD., Tokyo (JP)

(72) Inventor: Tomoyuki Mizunashi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 30 days.

(21) Appl. No.: 16/457,494

(22) Filed: Jun. 28, 2019

(65) Prior Publication Data

US 2020/0002534 A1   Jan. 2, 2020

(30) Foreign Application Priority Data

Jun. 29, 2018   (JP) ............... JP2018-124806

(51) Int. Cl.
  *C08L 83/04*   (2006.01)
  *C08G 77/44*   (2006.01)

(52) U.S. Cl.
  CPC .............. *C08L 83/04* (2013.01); *C08G 77/44* (2013.01); *C08L 2203/20* (2013.01)

(58) Field of Classification Search
  None
  See application file for complete search history.

(56) References Cited

U.S. PATENT DOCUMENTS

| | | | |
|---|---|---|---|
| 6,124,407 A | 9/2000 | Lee et al. | |
| 7,527,871 B2 | 5/2009 | Morita et al. | |
| 8,044,153 B2 | 10/2011 | Yamamoto et al. | |
| 2016/0208055 A1* | 7/2016 | Horstman | C08G 77/20 |

FOREIGN PATENT DOCUMENTS

| | | |
|---|---|---|
| JP | 2005-105217 A | 4/2005 |
| JP | 2006-213789 A | 8/2006 |
| JP | 2007-131694 A | 5/2007 |
| JP | 2008-156578 A | 7/2008 |
| JP | 2011-252175 A | 12/2011 |

* cited by examiner

*Primary Examiner* — Robert S Loewe
(74) *Attorney, Agent, or Firm* — Birch, Stewart, Kolasch & Birch, LLP

(57) ABSTRACT

A curable organosilicon resin composition is provided comprising (A) an organopolysiloxane of block polymer structure consisting of 30 to 80 mol % of $R^1SiO_{3/2}$, 10 to 70 mol % of $(R^1)_2SiO_{2/2}$ and 0 to 30 mol % of $(R^1)_3SiO_{1/2}$ units, having Mw of 5,000-100,000, and containing at least a part of the $(R^1)_2SiO_{2/2}$ unit having an average number of 3 to 80 repetitions, at least two silicon-bonded alkenyl groups per molecule, 0.001 to 1.0 mol/100 g of silicon-bonded hydroxyl groups, and up to 1.0 mol/100 g of silicon-bonded alkoxy groups, (B) an organohydrogenpolysiloxane containing at least two SiH groups and at least one silicon-bonded aryl group per molecule, and (C) a hydrosilylation catalyst.

3 Claims, No Drawings

CURABLE ORGANOSILICON RESIN COMPOSITION AND SEMICONDUCTOR DEVICE

CROSS-REFERENCE TO RELATED APPLICATION

This non-provisional application claims priority under 35 U.S.C. § 119(a) on Patent Application No. 2018-124806 filed in Japan on Jun. 29, 2018, the entire contents of which are hereby incorporated by reference.

TECHNICAL FIELD

This invention relates to a curable organosilicon resin composition and a semiconductor device.

BACKGROUND ART

LED encapsulants are desired to have excellent transparency, refractive index, mechanical properties, heat resistance, and light resistance. In the prior art, epoxy resins, poly(meth)acrylates and polycarbonates are often used as the encapsulant. Since LED light-emitting devices become of higher power and are used for a long time in a high-temperature environment, these thermoplastic resins have problems with respect to heat resistance and discoloration resistance.

Recently, lead-free solders are often used. Since the lead-free solders have a higher melting temperature than conventional solders, optical chips are usually soldered to substrates while heating at a temperature of 260° C. or higher. Lenses of prior art thermoplastic resins are no longer used because the lenses will deform during soldering at high temperature or yellow due to the heat.

Under such circumstances, many attempts were made to manufacture LED lenses having excellent heat resistance from silicone resins composed of M units and Q units, known as MQ resins. See Patent Documents 1 to 3.

Since these silicone resins lack strength, the process of molding a silicone resin on a substrate to form a lens thereon has the drawbacks that the lens can peel from the substrate and the resin can crack due to stresses associated with mold release in the molding step or external stresses applied after the molding step. To overcome these drawbacks, Patent Document 4 proposes a composition comprising a vinyl resin having T units, typically $PhSiO_{3/2}$ incorporated and a MQ resin having SiH groups. The resin having T units incorporated is mitigated in brittleness, but has so low hot strength that the composition is awkward to mold. Patent Document 5 uses a silicone resin composed of M, D, and Q units for the purposes of improving workability and rubber properties. None of these compositions satisfy excellent mechanical properties, heat resistance, and light resistance.

CITATION LIST

Patent Document 1: JP-A 2006-213789
Patent Document 2: JP-A 2007-131694
Patent Document 3: JP-A 2011-252175 (U.S. Pat. No. 6,124,407)
Patent Document 4: JP-A 2005-105217 (U.S. Pat. No. 7,527,871)
Patent Document 5: JP-A 2008-156578

SUMMARY OF INVENTION

An object of the invention is to provide a curable organosilicon resin composition which is effectively moldable and curable into a cured product having transparency, heat resistance, and mechanical properties, and a semiconductor device comprising an LED chip encapsulated with the cured composition.

The inventor has found that a curable organopolysiloxane resin composition is obtained using a curable organosilicon resin composition containing an organopolysiloxane of block polymer structure having a specific resin structure and a linear structure, the composition is effectively moldable and curable into a cured product having improved transparency, heat resistance, and mechanical properties, and a semiconductor device comprising an LED chip encapsulated with the cured composition is useful.

In one aspect, the invention provides a curable organosilicon resin composition comprising:

(A) 100 parts by weight of an organopolysiloxane of block polymer structure consisting of 30 to 80 mol % of $R^1SiO_{3/2}$ units, 10 to 70 mol % of $(R^1)_2SiO_{2/2}$ units, and 0 to 30 mol % of $(R^1)_3SiO_{1/2}$ units wherein R' is independently a hydroxyl, $C_2$-$C_{10}$ alkenyl, substituted or unsubstituted alkyl, $C_1$-$C_{10}$ alkoxy or $C_6$-$C_{10}$ aryl group, in which at least some of the $(R^1)_2SiO_{2/2}$ units continuously repeat and the average number of repeating units is 3 to 80, the organopolysiloxane having a weight average molecular weight of 5,000 to 100,000 and containing at least two silicon-bonded alkenyl groups per molecule, 0.001 to 1.0 mol/100 g of silicon-bonded hydroxyl groups, and up to 1.0 mol/100 g of silicon-bonded alkoxy groups, (B) an organohydrogenpolysiloxane containing at least two silicon-bonded hydrogen atoms (i.e., SiH groups) and at least one silicon-bonded aryl group per molecule, in an amount to give 0.1 to 4.0 moles of SiH groups in component (B) per mole of alkenyl groups in component (A), and (C) a hydrosilylation catalyst in an amount to give 0.1 to 500 ppm of platinum group metal based on the total weight of components (A) and (B).

The composition may further comprise (D) a cyclic polysiloxane having the formula (1):

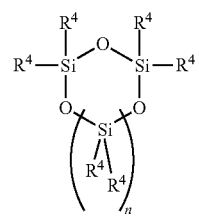

wherein $R^4$ is independently hydrogen, a $C_2$-$C_{10}$ alkenyl, $C_1$-$C_{10}$ substituted or unsubstituted alkyl or $C_6$-$C_{10}$ aryl group and n is an integer of 1 or 2, the cyclic polysiloxane being present in an amount of 0.1 to 30% by weight based on the total weight of components (A) and (B), and in an amount to give 0.1 to 4.0 moles of total SiH groups in components (B) and (D) per mole of total alkenyl groups in components (A) and (D) when component (D) has an alkenyl group and/or SiH group.

The composition is cured into a cured product preferably having a refractive index of 1.43 to 1.57 at 23° C. and 589 nm as measured according to method A of JIS K 7142-2014.

A semiconductor device comprising an LED chip encapsulated with the cured organosilicon resin composition is also contemplated.

Advantageous Effects of Invention

According to the invention, there is provided a curable organosilicon resin composition which is effectively moldable and curable into a cured product having improved transparency, heat resistance, and mechanical properties. A semiconductor device comprising an LED chip encapsulated with the composition is also provided.

DESCRIPTION OF PREFERRED EMBODIMENTS

As used herein, the notation (Cn-Cm) means a group containing from n to m carbon atoms per group. In chemical formulae, Me stands for methyl, Vi for vinyl, and Ph for phenyl.

Curable Organosilicon Resin Composition

The invention is directed to a curable organosilicon resin composition comprising the following components (A) to (C), which are described below in detail.

(A) Organopolysiloxane

Component (A) is an organopolysiloxane of block polymer structure consisting of 30 to 80 mol % of $R^1SiO_{3/2}$ units, 10 to 70 mol % of $(R^1)_2SiO_{2/2}$ units, and 0 to 30 mol % of $(R^1)_3SiO_{2/2}$ units wherein $R^1$ is independently a hydroxyl, $C_2$-$C_{10}$ alkenyl, $C_1$-$C_{10}$ substituted or unsubstituted alkyl, $C_1$-$C_{10}$ alkoxy or $C_6$-$C_{10}$ aryl group and wherein at least some of the $(R^1)_2SiO_{2/2}$ units continuously repeat and the average number of repeating units is 3 to 80. The organopolysiloxane has a weight average molecular weight of 5,000 to 100,000 and contains at least two silicon-bonded alkenyl groups per molecule, 0.001 to 1.0 mol/100 g of silicon-bonded hydroxyl groups, and up to 1.0 mol/100 g of silicon-bonded alkoxy groups.

The organopolysiloxane (A) should have a weight average molecular weight (Mw) of 5,000 to 100,000, preferably 6,000 to 50,000. A Mw of at least 5,000 eliminates the risk that the composition is not cured whereas a Mw of up to 100,000 eliminates the risk that the composition has too high a viscosity to flow.

It is noted that the weight average molecular weight (Mw) is measured by gel permeation chromatography (GPC) versus polystyrene standards under the following conditions.

Measurement conditions
Developing solvent: tetrahydrofuran (THF)
Flow rate: 0.6 mL/min
Detector: refractive index (RI) detector
Column: TSK Guardcolumn SuperH-L
  TSKgel SuperH4000 (6.0 mm ID×15 cm, 1 column)
  TSKgel SuperH3000 (6.0 mm ID×15 cm, 1 column)
  TSKgel SuperH2000 (6.0 mm ID×15 cm, 2 columns)
    (all from Tosoh Corp.)
Column temperature: 40° C.
Sample amount injected: 20 µL of THF solution with concentration 0.5 wt %

Component (A) contains at least two silicon-bonded alkenyl groups per molecule. The content of alkenyl groups in component (A) is 0.002 to 0.5 mol/100 g, preferably 0.003 to 0.3 mol/100 g, and more preferably 0.005 to 0.2 mol/100 g. An alkenyl content of at least 0.002 mol/100 g eliminates the risk that the composition is not hardened due to short crosslinking sites. An alkenyl content of up to 0.5 mol/100 g avoids the risk that toughness is lost due to an increased crosslinking density.

Component (A) contains 0.001 to 1.0 mol/100 g, preferably 0.005 to 0.8 mol/100 g, and more preferably 0.008 to 0.6 mol/100 g of silicon-bonded hydroxyl groups. A hydroxyl content of at least 0.001 mol/100 g eliminates the risk that the composition is not hardened due to short crosslinking sites. A hydroxyl content of up to 1.0 mol/100 g eliminates the risk of dust deposition due to surface tack.

Component (A) contains up to 1.0 mol/100 g, preferably up to 0.8 mol/100 g, and more preferably up to 0.5 mol/100 g of silicon-bonded alkoxy groups. An alkoxy content of up to 1.0 mol/100 g eliminates the risk that alcohol gas is generated as by-product upon curing. Then no voids are left in the cured product.

It is noted that the contents of silicon-bonded hydroxyl groups and silicon-bonded alkoxy groups are measured by $^1$H-NMR and $^{29}$Si-NMR spectroscopy.

Component (A) is an organopolysiloxane consisting of 30 to 80 mol % of $R'SiO_{3/2}$ units (T units), 10 to 70 mol % of $(R^1)_2SiO_{2/2}$ units (D units), and 0 to 30 mol % of $(R^1)_3SiO_{1/2}$ units (M units). The organopolysiloxane has a block polymer structure in which at least some of the $(R^1)_2SiO_{2/2}$ units (D units) continuously repeat and the average number of repeating units is 3 to 80. As long as the number of repeating units is at least 3, any loss of resin strength is avoided. As long as the number of repeating units is up to 80, there is no risk that the molecular weight builds up to hinder flow. It is noted that the average number of repeating $(R^1)_2SiO_{2/2}$ units is measured by $^{29}$Si-NMR spectroscopy.

In M, D and T units, $R^1$ is independently a hydroxyl group, $C_2$-$C_{10}$ alkenyl group, $C_1$-$C_{10}$ substituted or unsubstituted alkyl group, $C_1$-$C_{10}$ alkoxy group or $C_6$-$C_{10}$ aryl group. Examples include alkyl groups such as methyl, ethyl, propyl and butyl; alkoxy groups such as methoxy, ethoxy and propoxy; alkenyloxy groups such as propenoxy; cycloalkyl groups such as cyclohexyl; aryl groups such as phenyl, tolyl and xylyl; aralkyl groups such as benzyl; alkenyl groups such as vinyl, allyl, propenyl, isopropenyl, butenyl, hexenyl, cyclohexenyl and octenyl; and substituted forms of the foregoing alkyl groups in which some or all of the hydrogen atoms are substituted by halogen (e.g., fluorine, bromine and chlorine), cyano or the like, such as chloromethyl, cyanoethyl and 3,3,3-trifluoropropyl.

Suitable materials from which $R^1SiO_{3/2}$ units (T units) are derived include organosilicon compounds such as organotrichlorosilanes and organotrialkoxysilanes having the following structural formulae and condensation products thereof, but are not limited thereto.

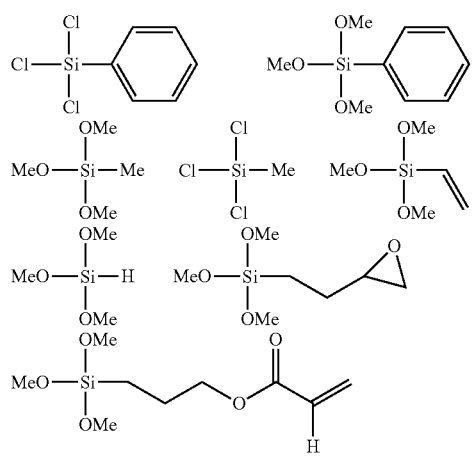

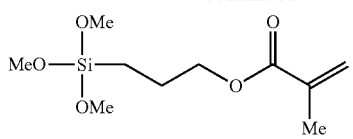

Suitable materials from which $(R^1)_2SiO_{2/2}$ units (D units) are derived include organosilicon compounds such as diorganodichlorosilanes and diorganodialkoxysilanes having the following structural formulae, but are not limited thereto.

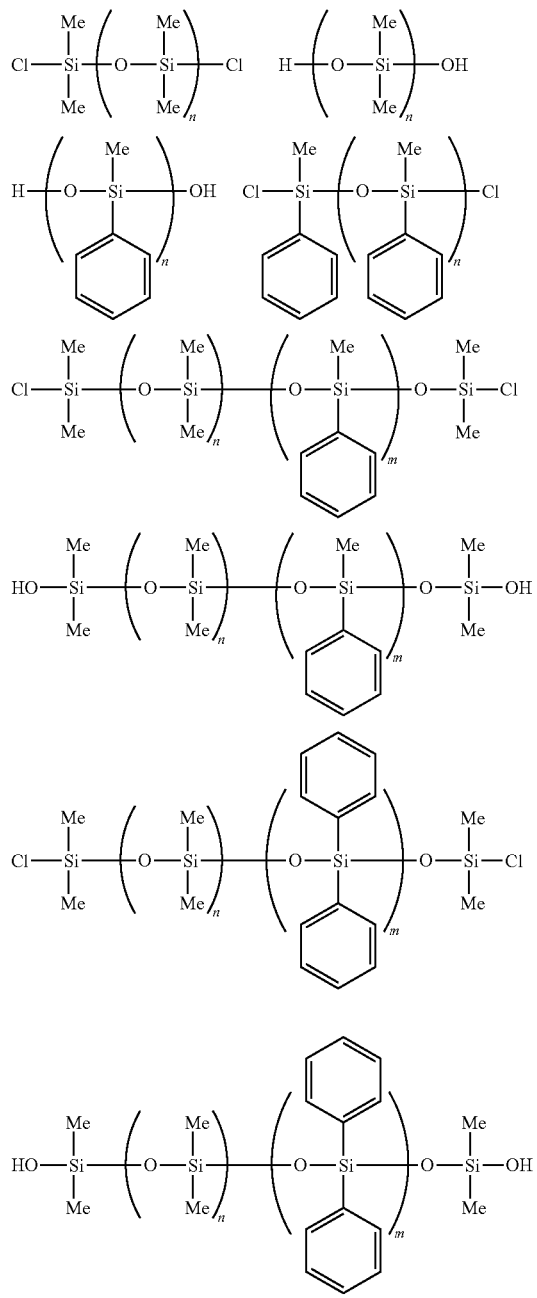

Herein n is an integer of 5 to 80, m is an integer of 5 to 80, and n+m≤78.

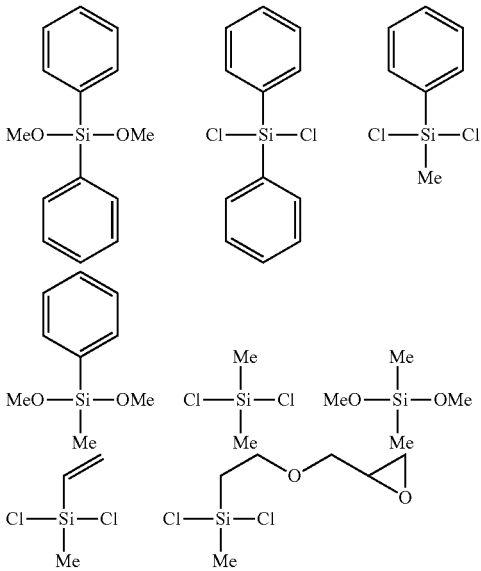

Suitable materials from which $(R^1)_3SiO_{1/2}$ units (M units) are derived include organosilicon compounds such as triorganochlorosilanes, triorganoalkoxysilanes, and hexaorganodisioxanes having the following structural formulae, but are not limited thereto.

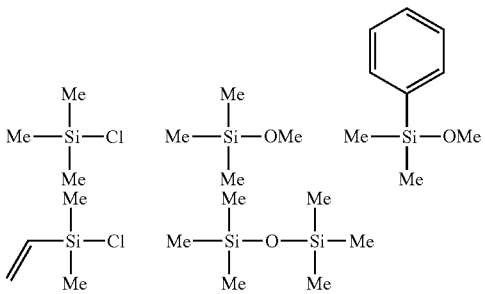

(B) Organohydrogenpolysiloxane

Component (B) is an organohydrogenpolysiloxane containing at least two silicon-bonded hydrogen atoms (i.e., SiH groups) and at least one silicon-bonded aryl group per molecule. Specifically, it has the average compositional formula (2).

$$R^2_h H_i SiO_{(4-h-i)/2} \qquad (2)$$

Herein $R^2$ which may be the same or different is a substituted or unsubstituted $C_1$-$C_{10}$ monovalent hydrocarbon group free of aliphatic unsaturation such as alkenyl, h and i are positive numbers in the range of 0.7≤h≤2.1, 0.001≤i≤1.0, and 0.8≤h+i≤3.0, preferably 1.0≤h≤2.0, 0.01≤i≤1.0, and 1.5≤h+i≤2.5.

Examples of $R^2$ include monovalent hydrocarbon groups, for example, saturated aliphatic hydrocarbon groups such as methyl, ethyl, propyl, butyl and pentyl, saturated cyclic hydrocarbon groups such as cyclopentyl and cyclohexyl, aromatic hydrocarbon groups including aryl groups such as phenyl and tolyl and aralkyl groups such as benzyl, phenylethyl and phenylpropyl, and halogenated monovalent hydrocarbon groups in which some or all of the carbon-bonded hydrogen atoms are substituted by halogen atoms (e.g., fluorine, bromine and chlorine), such as trifluoropropyl and chloropropyl, alkoxy groups such as methoxy, ethoxy and propoxy, alkoxyalkyl groups such as methoxymethyl and methoxyethyl, and alkenyloxy groups such as propenoxy. Of these, saturated aliphatic hydrocarbon groups of 1 to 5 carbon atoms such as methyl, ethyl and propyl are preferred as well as phenyl.

The organohydrogenpolysiloxane (B) has at least two (typically 2 to 200), preferably at least three (typically 3 to 100) silicon-bonded hydrogen atoms (i.e., SiH groups). Component (B) is reactive mainly with component (A) and serves as a crosslinker.

The molecular structure of component (B) is not particularly limited. It may have any molecular structure such as a linear, cyclic, branched or three-dimensional network (or resinous) structure. When component (B) has a linear structure, the SiH groups may be attached to the silicon atom at the end and/or side chain of the molecular chain. More preferred is an organohydrogenpolysiloxane in which the number of silicon atoms per molecule (i.e., degree of polymerization) is specifically about 2 to about 200, more specifically about 3 to about 100 and which is liquid or solid at room temperature (25° C.).

Examples of the organohydrogenpolysiloxane having formula (2) include tris(hydrogendimethylsiloxy)phenylsilane, both end trimethylsiloxy-blocked methylhydrogensiloxane/diphenylsiloxane copolymers, both end trimethylsiloxy-blocked methylhydrogensiloxane/diphenyl-siloxane/dimethylsiloxane copolymers, both end trimethylsiloxy-blocked methylhydrogensiloxane/methylphenyl-siloxane/dimethyl-siloxane copolymers, both end dimethylhydrogensiloxy-blocked methylhydrogensiloxane/dimethyl-siloxane/diphenylsiloxane copolymers, both end dimethylhydrogensiloxy-blocked methylhydrogensiloxane/dimethyl-siloxane/methylphenylsiloxane copolymers, and copolymers consisting of $(CH_3)_2HSiO_{1/2}$ units, $SiO_{4/2}$ units and $(C_6H_5)_3SiO_{1/2}$ units.

Other examples of the organohydrogenpolysiloxane which can be used herein have the following structures, but are not limited thereto.

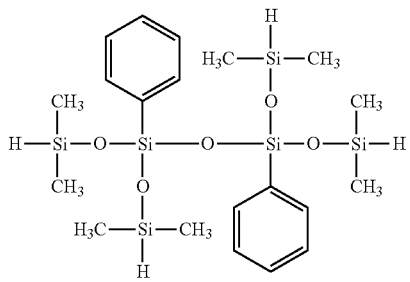

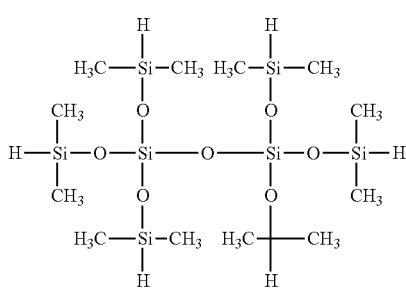

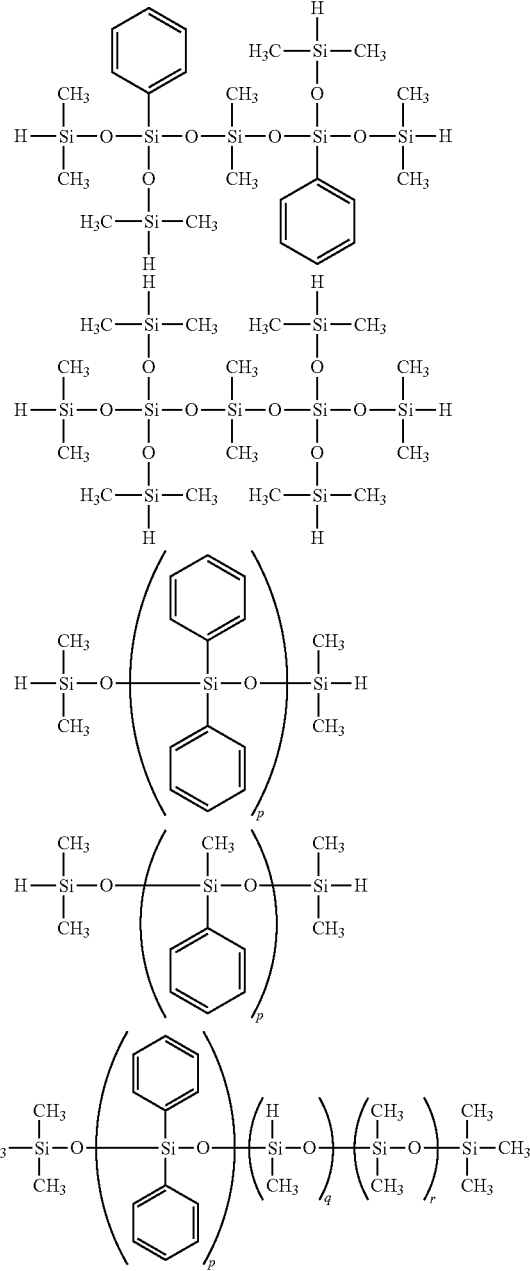

Herein p, q and r are positive integers.

Component (B) is blended in an amount to give 0.1 to 4.0 moles, preferably 0.5 to 3.0 moles, and more preferably 0.8 to 2.0 moles of SiH groups in component (B) per mole of silicon-bonded alkenyl groups in component (A). If the amount of SiH groups in component (B) is less than 0.1 mole, the composition may not undergo curing reaction, with difficulty to form a cured product. The cured product, if formed, may have a very low crosslinking density, which leads to a loss of mechanical strength and is detrimental to heat resistance. If the amount of SiH groups is more than 4.0 moles, many SiH groups remain unreacted in the cured product, which experiences a change with time of physical properties and has low heat resistance. Also, dehydrogenation reaction can occur in the cured product to create bubbles.

(C) Hydrosilylation Catalyst

Component (C) is a catalyst for hydrosilylation reaction and blended for the purpose of activating addition curing reaction of the composition. There are platinum, palladium and rhodium based catalysts. The catalyst may be any of prior art well-known catalysts for promoting hydrosilylation reaction. From the aspect of cost, platinum based catalysts such as platinum, platinum black and chloroplatinic acid are preferred. Examples include $H_2PtCl_6 \cdot pH_2O$, $K_2PtCl_6$, $KHPtCl_6 \cdot pH_2O$, $K_2PtCl_4$, $K_2PtCl_4 \cdot pH_2O$, $PtO_2 \cdot pH_2O$, $PtCl_4 \cdot pH_2O$, $PtCl_2$, and $H_2PtCl_4 \cdot pH_2O$, wherein p is a positive integer, and complexes thereof with hydrocarbons such as olefins, alcohols, and vinyl-containing organopolysiloxanes. The catalyst may be used alone or in admixture.

Component (C) may be blended in an effective amount for curing, typically in an amount to give 0.1 to 500 ppm, preferably 0.5 to 100 ppm of platinum group metal based on the total weight of components (A) and (B).

If necessary, a cure inhibitor may be blended in the composition. The cure inhibitor may be used alone or in admixture. The cure inhibitor is selected, for example, from organopolysiloxanes having a high content of vinyl groups such as tetramethyltetravinylcyclotetrasiloxane, triallyl isocyanurates, alkyl maleates, acetylene alcohols, silane or siloxane-modified forms of the foregoing compounds, hydroperoxides, tetramethylethylenediamine, benzotriazole and mixtures thereof. The cure inhibitor may be blended typically in an amount of 0.001 to 1.0 part, preferably 0.005 to 0.5 part by weight per 100 parts by weight of components (A) and (B) combined.

(D) Cyclic Polysiloxane

In the curable organosilicon resin composition, a cyclic polysiloxane having the following formula (1) may be blended as component (D).

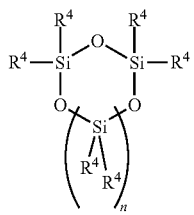

(1)

Herein $R^4$ is independently hydrogen, a $C_2$-$C_{10}$ alkenyl, $C_1$-$C_{10}$ substituted or unsubstituted alkyl or $C_6$-$C_{10}$ aryl group, and n is an integer of 1 or 2.

In formula (1), examples of $R^4$ include hydrogen; alkyl groups such as methyl, ethyl, propyl and butyl; cycloalkyl groups such as cyclohexyl; aryl groups such as phenyl, tolyl and xylyl; aralkyl groups such as benzyl; alkenyl groups such as vinyl, allyl, propenyl, isopropenyl, butenyl, hexenyl, cyclohexenyl and octenyl; and substituted forms of the foregoing alkyl groups in which some or all of the hydrogen atoms are substituted by halogen atoms (e.g., fluorine, bromine and chlorine), cyano or the like, such as chloromethyl, cyanoethyl and 3,3,3-trifluoropropyl.

The cyclic polysiloxane (D) may preferably be blended in an amount of 0.1 to 30% by weight, more preferably 0.2 to 20% by weight based on the total weight of components (A) and (B). If the amount of component (D) is less than 0.1% by weight, the composition may lose fluidity. If the amount of component (D) is more than 30% by weight, which means more volatile component, substantial shrinkage can occur upon curing. When component (D) has an alkenyl group and/or SiH group, component (D) is blended in an amount to give 0.1 to 4.0 moles, preferably 0.5 to 2.0 moles of total SiH groups in components (B) and (D) per mole of total alkenyl groups in components (A) and (D).

The cyclic organopolysiloxane of formula (1) used herein may be selected from cyclic polysiloxanes having the following structures, though not limited thereto.

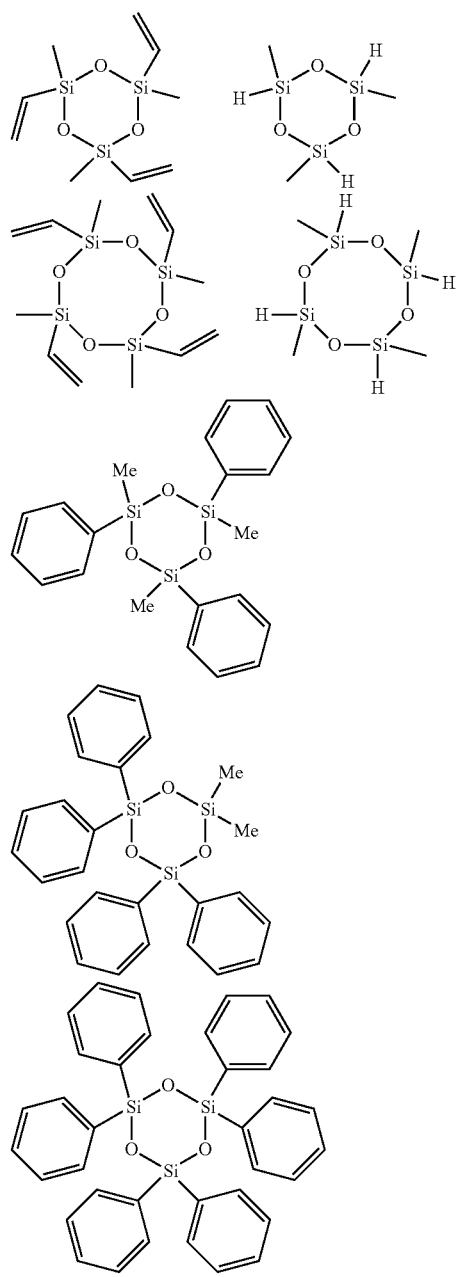

(E) Phosphor

The curable organosilicon resin composition may further contain a phosphor as component (E). Because of its excellent heat resistance and light resistance, the curable organosilicon resin composition containing a phosphor avoids any significant loss of fluorescent properties as often found in the prior art.

Examples of the phosphor include nitride based phosphors and oxynitride based phosphors activated mainly with a lanthanoid element such as Eu or Ce, alkaline earth metal halogen apatite phosphors, alkaline earth metal borate halogen phosphors, alkaline earth metal aluminate phosphors, alkaline earth metal silicate phosphors, alkaline earth metal sulfide phosphors, alkaline earth metal thiogallate phosphors, alkaline earth metal silicon nitride phosphors and germanate phosphors activated mainly with a lanthanoid element such as Eu or a transition metal element such as Mn, rare earth aluminate phosphors and rare earth silicate phosphors activated mainly with a lanthanoid element such as Ce, organic or organic complex phosphors activated mainly with a lanthanoid element such as Eu, and Ca—Al—Si—O—N based oxynitride glass phosphors. Of these, nitride based phosphors and oxynitride based phosphors activated mainly with a lanthanoid element such as Eu or Ce and alkaline earth metal halogen apatite phosphors activated mainly with a transition metal element such as Mn are preferred. The phosphor may preferably be blended in an amount of 0 to 500 parts, more preferably 0 to 300 parts by weight per 100 parts by weight of components (A) to (D) combined.

In addition to components (A) to (E), any of well-known adhesion promoters and additives may further be blended in the curable organosilicon resin composition, if necessary.

Examples of the adhesion promoter include phenyltrimethoxysilane, trimethoxysilane, triethoxysilane, methyldimethoxysilane, diphenyldimethoxysilane, methylphenyldimethoxysilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, 3-methacryloxypropylmethyldiethoxysilane, 3-methacryloxypropyltriethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, N-phenyl-3-aminopropyltrimethoxysilane, 3-mercaptopropyltrimethoxysilane, 3-isocyanatopropyltriethoxysilane, 3-cyanopropyltriethoxysilane, and oligomers thereof. The adhesion promoter may be used alone or in admixture. The adhesion promoter may preferably be blended in an amount of 0 to 10% by weight, more preferably 0 to 5% by weight based on the total weight of components (A) and (B).

Examples of the additive include reinforcing inorganic fillers such as silica, glass fiber and fumed silica, non-reinforcing inorganic fillers such as calcium carbonate, calcium silicate, titanium dioxide, ferric oxide, carbon black, zinc oxide, fatty acid cerium salts, fatty acid barium salts, cerium alkoxides and barium alkoxides, and nanofillers such as silicon dioxide (silica: $SiO_2$), zirconium oxide (zirconia: $ZrO_2$), titanium oxide ($TiO_2$), aluminum oxide (alumina: $Al_2O_3$), zinc oxide (ZnO), iron oxide ($FeO_2$), triiron tetraoxide ($Fe_3O_4$), lead oxide ($PbO_2$), tin oxide ($SnO_2$), cerium oxides ($Ce_2O_3$, $CeO_2$), calcium oxide (CaO), trimanganese tetraoxide ($Mn_3O_4$), magnesium oxide (MgO) and barium oxide (BaO). These additives may be blended in an amount of up to 600 parts (for example, 0 to 600 parts, typically 1 to 600 parts, and preferably 10 to 400 parts) by weight per 100 parts by weight of components (A) to (D) combined.

The organosilicon resin composition may be prepared by combining the above-described components (A) to (C), preferably components (A) to (D), optionally component (E), an adhesion promoter and additives and intimately mixing them.

The organosilicon resin composition may be applied to a substrate which is selected for a particular application, and then cured. With respect to curing conditions, the composition will cure to a full extent at room temperature (25° C.), although it may be cured by heating if necessary. In the latter case, the composition may be heated at a temperature of 60 to 200° C., for example.

When the organosilicon resin composition is heat cured, the cured product preferably has a direct light transmittance of at least 70%, more preferably at least 80% at a wavelength of 400 to 800 nm, especially 450 nm across a sample of 1 mm thick. Notably, the direct light transmittance is measured by a spectrophotometer U-4100 (Hitachi High-Tech Science Corp.), for example.

The cured product obtained from heat curing of the organosilicon resin composition preferably has a refractive index of 1.43 to 1.57 at 23° C. and 589 nm as measured according to method A of JIS K 7142-2014.

Since the cured product has a direct light transmittance and refractive index in the range and is fully transparent, the composition is suitable for use in optical applications such as LED encapsulants.

Now that the curable organosilicon resin composition is as defined above, it cures into a cured product which is significantly improved in mechanical properties, transparency, crack resistance, and heat resistance.

Semiconductor Device

The invention also provides a semiconductor device comprising an LED chip encapsulated with a cured product of the curable organosilicon resin composition.

When a light-emitting semiconductor chip such as LED is encapsulated with the organosilicon resin composition, the composition is applied to the LED chip secured in a premolded thermoplastic resin package and then cured to the LED chip. Also, the organosilicon resin composition may be dissolved in an organic solvent such as toluene or xylene to form a varnish, which is applied to the LED chip.

Since the inventive curable organosilicon resin composition cures into a product having excellent transparency and heat resistance, it is suitable as lens materials, protective coating agents and molding agents for light-emitting semiconductor devices and especially useful for the encapsulation of LED chips such as blue, white and UV LEDs. The organosilicon resin composition also has good heat resistance. When a silicate based phosphor or quantum dot phosphor is added to the composition for use as a wavelength converting film-forming material, the composition exhibits long-term reliability under humid conditions. Also, light-emitting semiconductor devices having good humidity resistance and long-term color rendering properties is provided.

Since the cured product has excellent properties including heat resistance, UV resistance, transparency, crack resistance and long-term reliability, the curable organosilicon resin composition is an optimum material in optical applications, for example, display materials, optical recording media materials, optical equipment materials, optical component materials, optical fiber materials, optoelectronic functional organic materials, and semiconductor IC peripheral materials.

EXAMPLES

Examples of the invention are given below by way of illustration and not by way of limitation. All parts are by weight.

Example 1

A silicone rubber composition was prepared by combining and thoroughly stirring the following components:

(A) 30 parts of a branched phenylmethylpolysiloxane consisting of 55 mol % of $PhSiO_{3/2}$ units, 40 mol % of $Me_2SiO_{2/2}$ units and 5 mol % of $ViMe_2SiO_{1/2}$, units (Mw=50,000, silicon-bonded hydroxyl content: 0.8 mol/100 g, silicon-bonded alkoxy content: 0.5 mol/100 g, average number of continuous $Me_2SiO_{2/2}$ units: 20), (B) an organohydrogenpolysiloxane having the formula (3):

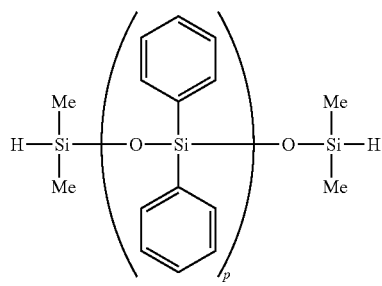

wherein p=1, in such an amount that the ratio of the total number of silicon-bonded hydrogen atoms in component (B) to the total number of silicon-bonded vinyl groups in components (A) and (D) (i.e., SiH/SiVi ratio) was 1.0, (C) 0.01 part of octyl alcohol-modified chloroplatinic acid solution (platinum content: 1 wt %), and (D) 5 parts of an organosilicon compound having the formula (4).

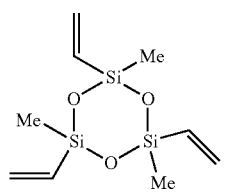

The composition was heat molded at 150° C. for 4 hours into a cured product (120 mm×110 mm×1 mm), which was measured for physical properties as will be described later. The results are shown in Table 1.

Example 2

A silicone rubber composition was prepared by combining and thoroughly stirring the following components:

(A) 30 parts of a branched phenylmethylpolysiloxane consisting of 50 mol % of $PhSiO_{3/2}$ units, 40 mol % of $Me_2SiO_{2/2}$ units and 10 mol % of $ViMe_2SiO_{1/2}$ units (Mw=10,000, silicon-bonded hydroxyl content: 0.8 mol/100 g, average number of continuous $Me_2SiO_{2/2}$ units: 20), (B) an organohydrogenpolysiloxane having the formula (3):

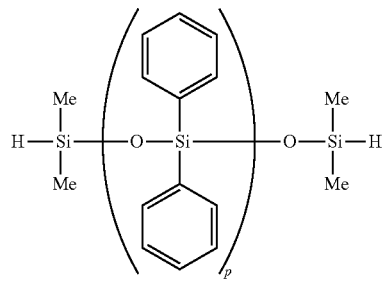

wherein p=1, in such an amount that the ratio of the number of silicon-bonded hydrogen atoms in component (B) to the number of silicon-bonded vinyl groups in component (A) (i.e., SiH/SiVi ratio) was 1.0, and (C) 0.01 part of an octyl alcohol-modified chloroplatinic acid solution (platinum content: 1 wt %). The composition was heat molded at 150° C. for 4 hours to form a cured product (120 mm×110 mm×1 mm), which was measured for physical properties. The results are shown in Table 1.

Example 3

A cured product was formed as in Example 1 except that 30 parts of a branched phenylmethylpolysiloxane consisting of 50 mol % of $PhSiO_{3/2}$ units, 35 mol % of $Me_2SiO_{2/2}$ units, 5 mol % of $ViMeSiO_{2/2}$ units and 10 mol % of $ViMe_2SiO_{1/2}$ units (Mw=100,000, silicon-bonded hydroxyl content: 0.02 mol/100 g, silicon-bonded alkoxy content: 0.04 mol/100 g, average number of continuous $Me_2SiO_{2/2}$ units: 80) was used instead of component (A) in Example 1, and was measured for physical properties. The results are shown in Table 1.

Example 4

A cured product was formed as in Example 1 except that 30 parts of a branched phenylmethylpolysiloxane consisting of 50 mol % of $PhSiO_{3/2}$ units, 20 mol % of $Me_2SiO_{2/2}$ units, 20 mol % of $PhMeSiO_{2/2}$ units and 10 mol % of $ViMe_2SiO_{u2}$ units (Mw=5,000, silicon-bonded hydroxyl content: 0.001 mol/100 g, silicon-bonded alkoxy content: 1.0 mol/100 g, average number of continuous $Me_2SiO_{2/2}$ units: 5, average number of continuous $PhMeSiO_{2/2}$ units: 5) was used instead of component (A) in Example 1, and was measured for physical properties. The results are shown in Table 1.

Example 5

A cured product was formed as in Example 1 except that 5 parts of a cyclic polysiloxane having the formula (5) was used instead of component (D) in Example 1, and was measured for physical properties. The results are shown in Table 1.

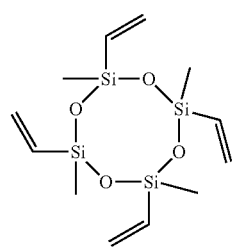

Example 6

A cured product was formed as in Example 1 except that 6 parts of an organohydrogenpolysiloxane having the formula (6) was used instead of component (B) in Example 1, and was measured for physical properties. The results are shown in Table 1.

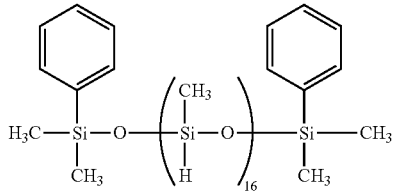

(6)

Example 7

A cured product was formed as in Example 1 except that a branched phenylmethylpolysiloxane consisting of 80 mol % of $PhSiO_{3/2}$ units, 10 mol % of $PhMeSiO_{2/2}$ units and 10 mol % of $ViMe_2SiO_{1/2}$ units (Mw=10,000, silicon-bonded hydroxyl content: 0.03 mol/100 g, silicon-bonded alkoxy content: 0.001 mol/100 g, average number of continuous $PhMeSiO_{2/2}$ units: 10) was used instead of component (A) in Example 1, and was measured for physical properties. The results are shown in Table 1.

Example 8

A cured product was formed as in Example 1 except that 10 parts of a cyclic polysiloxane having the formula (7) was used instead of component (D) in Example 1, and was measured for physical properties. The results are shown in Table 1.

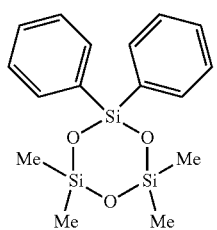

(7)

Comparative Example 1

A cured product was formed as in Example 1 except that a branched phenylmethylpolysiloxane consisting of 50 mol % of $PhSiO_{3/2}$ units, 40 mol % of $Me_2SiO_{2/2}$ units and 10 mol % of $Me_3SiO_{1/2}$ units (Mw=110,000, silicon-bonded hydroxyl content: 0.5 mol/100 g, silicon-bonded alkoxy content: 0.05 mol/100 g, average number of continuous $Me_2SiO_{2/2}$ units: 90) was used instead of component (A) in Example 1, and was measured for physical properties. The results are shown in Table 2.

Comparative Example 2

A cured product was formed as in Example 1 except that a branched phenylmethylpolysiloxane consisting of 50 mol % of $PhSiO_{3/2}$ units, 40 mol % of $Me_2SiO_{2/2}$ units and 10 mol % of $Me_3SiO_{1/2}$ units (Mw=4,500, silicon-bonded hydroxyl content: 0.5 mol/100 g, silicon-bonded alkoxy content: 0.05 mol/100 g, average number of continuous $Me_2SiO_{2/2}$ units: 4) was used instead of component (A) in Example 1, and was measured for physical properties. The results are shown in Table 2.

Comparative Example 3

A cured product was formed as in Example 1 except that a branched phenylmethylpolysiloxane consisting of 50 mol % of $PhSiO_{3/2}$ units, 40 mol % of $Me_2SiO_{2/2}$ units and 10 mol % of $ViMe_2SiO_{1/2}$ units (Mw=15,000, silicon-bonded hydroxyl content: 1.2 mol/100 g, silicon-bonded alkoxy content: 0.05 mol/100 g, average number of continuous $Me_2SiO_{2/2}$ units: 60) was used instead of component (A) in Example 1, and was measured for physical properties. The results are shown in Table 2.

Comparative Example 4

A cured product was formed as in Example 1 except that a branched phenylmethylpolysiloxane consisting of 50 mol % of $PhSiO_{3/2}$ units, 40 mol % of $Me_2SiO_{2/2}$ units and 10 mol % of $ViMe_2SiO_{1/2}$ units (Mw=45,000, silicon-bonded hydroxyl content: 0,0005 mol/100 g, silicon-bonded alkoxy content: 0.05 mol/100 g, average number of continuous $Me_2SiO_{2/2}$ units: 70) was used instead of component (A) in Example 1, and was measured for physical properties. The results are shown in Table 2.

Comparative Example 5

A cured product was formed as in Example 1 except that a branched phenylmethylpolysiloxane consisting of 50 mol % of $PhSiO_{3/2}$ units, 40 mol % of $Me_2SiO_{2/2}$ units and 10 mol % of $ViMe_2SiO_{1/2}$ units (Mw=15,000, silicon-bonded hydroxyl 0.5 content: 0.7 mol/100 g, silicon-bonded alkoxy content: 1.3 mol/100 g, average number of continuous $Me_2SiO_{2/2}$ units: 70) was used instead of component (A) in Example 1, and was measured for physical properties. The results are shown in Table 2.

Comparative Example 6

A cured product was formed as in Example 1 except that a branched phenylmethylpolysiloxane consisting of 25 mol % of $PhSiO_{3/2}$ units, 65 mol % of $PhMeSiO_{2/2}$ units and 10 mol % of $ViMe_2SiO_{1/2}$ units (Mw=10,000, silicon-bonded hydroxyl content: 0.05 mol/100 g, silicon-bonded alkoxy content: 0.01 mol/100 g, average number of continuous $PhMeSiO_{2/2}$ units: 30) was used instead of component (A) in Example 1, and was measured for physical properties. The results are shown in Table 2.

Comparative Example 7

A cured product was formed as in Example 1 except that a branched phenylmethylpolysiloxane consisting of 70 mol % of $PhSiO_{3/2}$ units, 20 mol % of $PhMeSiO_{2/2}$ units and 10 mol % of $ViMe_2SiO_{1/2}$ units (Mw=10,000, silicon-bonded hydroxyl content: 0.05 mol/100 g, silicon-bonded alkoxy content: 0.02 mol/100 g, average number of continuous $PhMeSiO_{2/2}$ units: 1.5) was used instead of component (A) in Example 1, and was measured for physical properties. The results are shown in Table 2.

Comparative Example 8

A cured product was formed as in Example 1 except that a branched phenylmethylpolysiloxane consisting of 85 mol % of $PhSiO_{3/2}$ units, 5 mol % of $Me_2SiO_{2/2}$ units and 10 mol % of $Me_3SiO_{1/2}$ units (Mw=10,000, silicon-bonded hydroxyl content: 0.06 mol/100 g, silicon-bonded alkoxy content: 0.03 mol/100 g, average number of continuous $PhMeSiO_{2/2}$ units: 6) was used instead of component (A) in Example 1, and was measured for physical properties. The results are shown in Table 2.

Comparative Example 9

A cured product was formed as in Example 1 except that a branched phenylmethylpolysiloxane consisting of 75 mol % of $PhSiO_{3/2}$ units and 25 mol % of $ViMe_2SiO_{1/2}$ units (Mw=3,000, silicon-bonded hydroxyl content: 0.05 mol/100 g, silicon-bonded alkoxy content: 0.02 mol/100 g) was used instead of component (A) in Example 1, and was measured for physical properties. The results are shown in Table 2.

Measurement of Physical Properties of Composition/Cured Product

The resin compositions and the cured products thereof in Examples and Comparative Examples were measured for physical properties by the following methods.

(1) Appearance

Each composition was heat cured at 150° C. for 4 hours into a cured product of 1 mm thick, which was visually observed for color and transparency.

(2) State

Each composition before curing was evaluated for fluidity by placing 50 g of the composition in a 100-ml glass bottle, laying the glass bottle on its side, and allowing to stand at 25° C. for 10 minutes. The resin which flowed out of the bottle within the time was judged liquid.

(3) Viscosity

The viscosity of each composition before curing was measured at 25° C. according to the method described in JIS K7117-1: 1999.

(4) Direct Light Transmittance

Each composition was heat cured at 150° C. for 4 hours into a cured product of 1 mm thick, which was measured for direct light transmittance at wavelength 450 nm by a spectrophotometer U-4100 (Hitachi High-Tech Science Corp.).

(5) Refractive Index

Each composition was heat cured at 150° C. for 4 hours into a cured product, which was measured for refractive index at 23° C. and wavelength 589 nm by an Abbe refractometer according to JIS K7142: 2014, method A.

(6) Hardness (Type A)

Each composition was heat cured at 150° C. for 4 hours into a cured product, which was measured for hardness by Durometer type A according to JIS K6249: 2003.

(7) Elongation at Break and Tensile Strength

Each composition was heat cured at 150° C. for 4 hours into a cured product, which was measured for elongation at break and tensile strength according to JIS K6249: 2003.

(8) Moldability

Each composition, 0.25 g, was molded at 120° C. for 180 seconds on a silver plate (surface area 180 mm²) so as to define a bottom area of 45 mm², and parted from the mold. The molded product was inspected whether or not it remained adhered to the plate in the parting step without separation or cracking. Rating is according to the following criterion.

Criterion

OK: good molding (i.e., no cracks in the molded product)

NG: poor molding (i.e., cracks in the molded product)

(9) Adhesion

Each composition, 0.25 g, was molded on a silver plate (surface area 180 mm²) so as to define a bottom area of 45 mm² and cured at 150° C. for 4 hours. With a micro spatula, the cured product was broken and stripped off from the silver plate. Cohesive failure (CF) areas and peeled areas were determined. Adhesion is rated according to the following criterion.

Criterion

OK: good adhesion (i.e., CF area≥60%)

NG: poor adhesion (i.e., CF area<60%)

Each composition was heat cured at 150° C. for 4 hours into a cured product. The cured product was visually observed for dust deposition on its surface.

(10) Crack Resistance

Each composition was heat cured at 150° C. for 4 hours into a cured product of 1 mm thick. The cured product was further heat treated at 200° C. for 1,000 hours, and then, it was visually inspected for cracks.

TABLE 1

| Physical properties of composition/ cured product | Example | | | | | | | |
|---|---|---|---|---|---|---|---|---|
| | 1 | 2 | 3 | 4 | 5 | 6 | 7 | 8 |
| Appearance | colorless, transparent | colorless, transparent | colorless, transparent | colorless, transparent | colorless, transparent | colorless, transparent | colorless, transparent | colorless, transparent |
| State | liquid | liquid | liquid | liquid | liquid | liquid | liquid | liquid |
| Viscosity (Pa · s) | 40 | 30 | 60 | 15 | 36 | 40 | 40 | 45 |
| Direct light transmittance (%) | 99 | 99 | 98 | 99 | 98 | 99 | 98 | 98 |
| Refractive index | 1.51 | 1.51 | 1.51 | 1.51 | 1.50 | 1.49 | 1.53 | 1.51 |
| Hardness (Type A) @ 150° C. × 4 h | 80 | 80 | 90 | 70 | 80 | 85 | 90 | 70 |
| Elongation at break (%) | 60 | 60 | 90 | 70 | 80 | 85 | 65 | 55 |
| Tensile strength (MPa) | 3 | 3 | 5 | 2 | 3 | 5 | 6 | 2 |
| Dust deposition due to surface tack | no | no | no | no | no | no | no | no |

TABLE 1-continued

| Physical properties of composition/ cured product | Example | | | | | | | |
|---|---|---|---|---|---|---|---|---|
| | 1 | 2 | 3 | 4 | 5 | 6 | 7 | 8 |
| Moldability | OK | OK | OK | OK | OK | OK | OK | OK |
| Adhesion (to Ag) | OK | OK | OK | OK | OK | OK | OK | OK |
| Crack resistance | no cracks | no cracks | no cracks | no cracks | no cracks | no cracks | no cracks | no cracks |

TABLE 2

| Physical properties of composition/ cured product | Comparative Example | | | | | | | | |
|---|---|---|---|---|---|---|---|---|---|
| | 1 | 2 | 3 | 4 | 5 | 6 | 7 | 8 | 9 |
| Appearance | colorless, transparent | colorless, transparent | colorless, transparent | colorless, transparent | colorless, transparent | colorless, transparent | colorless, transparent | colorless, transparent | colorless, transparent |
| State | semisolid | liquid | liquid | liquid | liquid | liquid | liquid | liquid | liquid |
| Viscosity (Pa·s) | 100< | 10 | 14 | 20 | 11 | 5 | 20 | 35 | 5 |
| Direct light transmittance (%) | 98 | 99 | 98 | 98 | 86 | 95 | 98 | 98 | 98 |
| Refractive index | 1.51 | 1.51 | 1.51 | 1.51 | 1.51 | 1.53 | 1.54 | 1.54 | 1.53 |
| Hardness (Type A) @ 150° C. × 4 h | 80 | 30 | 72 | 75 | 73 | 20 | 90 | 95 | 90 |
| Elongation at break (%) | 70 | 15 | 60 | 50 | 40 | 20 | 5 | 10 | 5 |
| Tensile strength (MPa) | 3 | 0.5 | 2 | 3 | 2 | 0.1 | 4 | 10 | 4 |
| Dust deposition due to surface tack | no | no | deposits | no | no | deposits | no | deposits | no |
| Moldability | OK | NG | OK | OK | OK | NG | OK | OK | NG |
| Adhesion (to Ag) | OK | OK | OK | NG | OK | OK | NG | OK | OK |
| Crack resistance | no cracks | no cracks | no cracks | no cracks | cracked | no cracks | cracked | cracked | no cracks |

As seen from Table 1, the resin compositions of Examples 1 to 8 using the inventive organopolysiloxane as component (A) were cured into products which had substantial transparency, sufficient hardness, elongation at break, and tensile strength as well as excellent refractive index, heat resistance, crack resistance, and adhesion, and were free of dust deposits due to surface tack.

By contrast, the resin composition of Comparative Example 1 using an organopolysiloxane having a Mw in excess of 100,000 as component (A) did not flow even in the uncured state and was awkward to work. The resin composition of Comparative Example 2 using an organopolysiloxane having a Mw of less than 5,000 as component (A) was cured into a product having an insufficient hardness and a lower strength than Examples 1 to 8, and cracked during molding.

The resin composition of Comparative Example 3 using an organopolysiloxane having a silicon-bonded hydroxyl content in excess of 1.0 mol/100 g as component (A) exhibited surface tack. The resin composition of Comparative Example 4 using an organopolysiloxane having a silicon-bonded hydroxyl content of less than 0.001 mol/100 g as component (A) was poor in adhesion. In the resin composition of Comparative Example 5 using an organopolysiloxane having a silicon-bonded alkoxy content in excess of 1.0 mol/100 g as component (A), voids were generated in curing and cracks propagated from the voids during crack resistance measurement. The resin composition of Comparative Example 6 using an organopolysiloxane containing less than 30 mol % of $R^1SiO_{3/2}$ units was brittle and had surface tack, and cracked during molding. The resin composition of Comparative Example 7 using an organopolysiloxane containing on the average less than 3 continuous $(R^1)_2SiO_{2/2}$ units had poor elongation and cracked during crack resistance measurement. The resin composition of Comparative Example 8 using an organopolysiloxane containing more than 80 mol % of $R^1SiO_{3/2}$ units was brittle and had surface tack. The resin composition of Comparative Example 9 using an organopolysiloxane containing no $(R^1)_2SiO_{2/2}$ units lacked hot strength during curing and cracked during molding.

It has been demonstrated that the curable organosilicon resin composition of the invention effectively flows and is rapidly cured into a product having excellent heat resistance and light resistance.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A curable organosilicon resin composition comprising:
  (A) 100 parts by weight of an organopolysiloxane of block polymer structure consisting of 30 to 80 mol % of $R^1SiO_{3/2}$ units, 10 to 70 mol % of $(R^1)_2SiO_{2/2}$ units, and 0 to 30 mol % of $(R^1)_3SiO_{1/2}$ units wherein $R^i$ is independently a hydroxyl, $C_2$-$C_{10}$ alkenyl, $C_1$-$C_{10}$ substituted or unsubstituted alkyl, $C_1$-$C_{10}$ alkoxy or $C_6$-$C_{10}$ aryl group, in which at least some of the $(R^1)_2SiO_{2/2}$ units continuously repeat and the average number of repeating units is 3 to 80, the organopolysiloxane having a weight average molecular weight of 5,000 to 100,000 and containing at least two silicon-bonded alkenyl groups per molecule, 0.001 to 1.0 mol/100 g of silicon-bonded hydroxyl groups, and up to 1.0 mol/100 g of silicon-bonded alkoxy groups, (B) an organohydrogenpolysiloxane containing at least two silicon-bonded hydrogen atoms (i.e., SiH groups) and at least one silicon-bonded aryl group per molecule, in an amount to give 0.1 to 4.0 moles of SiH groups in component (B) per mole of alkenyl groups in component (A), (C) a hydrosilylation catalyst in an amount to give 0.1 to 500 ppm of platinum group metal based on the total weight of components (A) and (B), and (D) a cyclic polysiloxane having the formula (1):

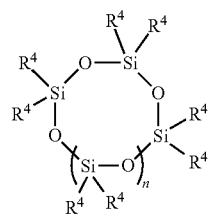

(1)

wherein $R^4$ is independently hydrogen, a $C_2$-$C_{10}$ alkenyl, $C_1$-$C_{10}$ substituted or unsubstituted alkyl or $C_6$-$C_{10}$ aryl group and n is an integer of 0 or 1, the cyclic polysiloxane being present in an amount of 0.1 to 30% by weight based on the total weight of components (A) and (B), and in an amount to give 0.1 to 4.0 moles of total SiH groups in components (B) and (D) per mole of total alkenyl groups in components (A) and (D) when component (D) has an alkenyl group and/or SiH group.

2. The composition of claim 1 which cures into a cured product having a refractive index of 1.43 to 1.57 at 23° C. and 589 nm as measured according to method A of JIS K 7142-2014.

3. A semiconductor device comprising an LED chip encapsulated with the cured organosilicon resin composition of claim 2.

* * * * *